(12) United States Patent
Salcido, Jr. et al.

(10) Patent No.: US 7,202,546 B2
(45) Date of Patent: Apr. 10, 2007

(54) INTEGRATED CIRCUIT WITH COPPER INTERCONNECT AND TOP LEVEL BONDING/INTERCONNECT LAYER

(75) Inventors: Salvador Salcido, Jr., Philomath, OR (US); Michael G. Kelly, Corvallis, OR (US); Michael D. Cusack, Boise, ID (US); Ravindhar K. Kaw, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 110 days.

(21) Appl. No.: 10/678,980

(22) Filed: Oct. 3, 2003

(65) Prior Publication Data
US 2005/0082675 A1    Apr. 21, 2005

(51) Int. Cl.
*H01L 29/00*    (2006.01)
*H01L 23/58*    (2006.01)

(52) U.S. Cl. .............. 257/503; 257/635; 257/E21.575

(58) Field of Classification Search ............... 257/758, 257/635, 211, 241, 324, E23.175, E25.016, 257/503, E21.575
See application file for complete search history.

(56) References Cited

U.S. PATENT DOCUMENTS

| | | | |
|---|---|---|---|
| 5,128,737 A * | 7/1992 | van der Have | 257/503 |
| 5,410,107 A * | 4/1995 | Schaper | 174/255 |
| 2004/0023436 A1* | 2/2004 | Lee | 438/108 |

* cited by examiner

*Primary Examiner*—Long K. Tran

(57) ABSTRACT

An integrated circuit including a copper interconnection layer includes an aluminum distribution layer overlying the copper interconnection layer to distribute external electrical signals such as power, ground, and clock signals throughout the die of the device. The distribution layer overlies the copper interconnection layer in a grid pattern which connects to the copper interconnection layer through a plurality of vias. The distribution layer further includes a plurality of wire bond pads to permit wire bonding between the distribution layer and bonding pads of the integrated circuit package.

22 Claims, 2 Drawing Sheets

INTEGRATED CIRCUIT WITH COPPER INTERCONNECT AND TOP LEVEL BONDING/INTERCONNECT LAYER

BACKGROUND OF THE INVENTION

Integrated circuits with copper interconnects are devices well known in the art. Such devices include a semiconductor substrate having circuits formed therein by diffusion. Overlying the substrate is usually one or more copper interconnect layers separated by insulating layers. The copper interconnect layers are configured to distribute external signals and power and ground about the integrated circuit and are connected to the integrated circuit by vias in the insulating layer or layers.

While such devices are used widely, it has been found that as circuit density increases, power delivery to the integrated circuits becomes increasingly difficult. This is at least partly due to die size, operating frequencies, and device leakage.

Integrated circuits with copper interconnects also can suffer from delamination. This delamination may be due to a mismatch of expansion coefficients between the package overmold compound used in the devices and the metal interconnects.

In the past, the above deficiencies have been addressed by the provision of wider metal interconnect tracks. This has also required additional power and ground cells to accommodate the wider metal interconnect tracks. Further, additional metal interconnect layers have been included in the devices. Still further, different molding compounds have been adapted for packaging the devices. Unfortunately, these measures are generally more expensive to employ.

In integrated circuits employing copper interconnects, connectivity to the package is accomplished by transition vias to top surface aluminum bond pads. The bonding pads are used as bonding sites for wire bonding or a solder bump redistribution layer.

The present invention provides an improved integrated circuit employing copper interconnects. The integrated circuit of the present invention provides protection against to copper interconnect delamination. It further provides power delivery to the devices with reduced resistance and increased reliability at reduced costs.

SUMMARY OF THE INVENTION

In accordance with one aspect of the present invention, the present invention provides an integrated circuit assembly having a substrate of semiconductor material including a circuit integrally formed therein, an interconnection layer overlying the substrate and making selective electrical connection to the circuit integrally formed in the substrate, the interconnect layer being formed of a first conductive material, and a distribution layer overlying the interconnection layer and including wire bonding pads for wire bonding to selected electrical signals. The distribution layer may be formed of a second conductive material. It may further include distribution grids connected to the wire bonding pads and extend over the interconnection layer. The assembly further includes a plurality of connecting channels connecting selected ones of the distribution grids to selected locations of the interconnection layer.

The first conductive material may be copper and the second conductive material may be aluminum. The selected locations of the interconnection layer may include power connections and at least one of the wire bonding pads may be coupled to the power connections. The selected locations of the interconnection layer may include ground connections and at least one of the wire bonding pads may be coupled to the ground connections. The connecting channels are preferably distributed throughout the distribution layer.

In accordance with further aspects of the present invention, the assembly may further include a package having a surface including wire bonding pads. The substrate may be mounted on the package surface. Wire bonds may then couple the wire bonding pads of the package to the wire bonding pads of the distribution layer. The wire bonding pads of the package may include ground and power pads. The wire bonding pads may further be disposed at the periphery of the distribution layer. The distribution grids may be configured as a star pattern or alternatively an orthogonal grid pattern.

In accordance with further aspects of the present invention, the invention provides an integrated circuit including a substrate of semiconductor material, a first metalization layer overlying the substrate, and an insulator layer overlaying the metalization layer and including a plurality of vias. The integrated circuit further includes a second metalization layer overlying the insulator layer and making selective contact with the first metalization layer through the vias. The second metalization layer includes wire bonding pads and distribution grids coupled to the bonding pads. The distribution grids are distributed over the insulator layer.

The first metalization layer may be a copper interconnection layer and the second metalization layer may be an aluminum distribution layer. The integrated circuit may further include a package supporting the substrate and including ground and power bonding pads wire bonded to the wire bonding pads.

BRIEF DESCRIPTION OF THE DRAWINGS

The foregoing aspects and many of the attended advantages of this invention will become more readily appreciated as the same become better understood by reference to the following detailed description, when taken in conjunction with the accompanying drawings, wherein.

DESCRIPTION OF THE INVENTION

Figure 1:
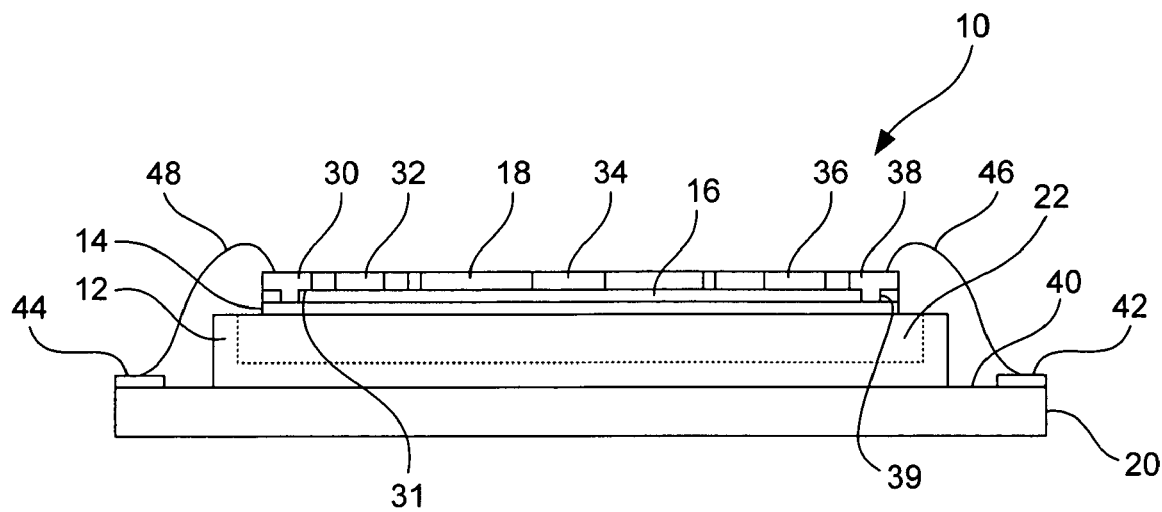
FIG. 1 is a side view of an integrated circuit assembly embodying the present invention including a processed semiconductor substrate mounted on its integrated circuit package.

Referring now to FIG. 1, it shows an integrated circuit assembly 10 embodying the present invention. The assembly 10 includes a processed semiconductor substrate 12, an interconnect layer 14, an insulator layer 16, and a distribution layer 18. The processed semiconductor substrate 12 is mounted on an integrated circuit package 20.

The semiconductor substrate 12 has been processed to include an integrated circuit 22 diffused therein. The integrated circuit 22 may be formed in the substrate 12 using diffusion and masking techniques well known in the art.

The interconnect layer 14 is formed of a first conductor such as, for example, copper. The copper interconnection layer 14 overlies the substrate 12 and selectively makes electrical connection to the circuit 22 integrally formed in this substrate in a manner well known in the art. As is well known in the art, the interconnection layer 14 may make selective electroconnection to the circuit 22 through vias formed in an intervening insulative layer. Further, the interconnection layer may comprise a plurality of interspersed conductive layer patterns and oxide layers as are also known in the art.

The distribution layer 18 is formed of a second conductive material which, for example, may preferably be aluminum. The distribution layer 18 includes a plurality of wire bonding pads at its periphery including bonding pads 30, 32, 34, 36, and 38 as may be seen in both FIGS. 1 and 2. The bonding pads 30 and 38 are electrically connected to the interconnection layer 14 through vias 31 and 39. The wire bonding pads 32, 34, and 36 are preferably similarly electrically connected to the interconnection layer 14 in this same manner. Such interconnections have not been illustrated in FIG. 1 so as to not unduly complicate the figure.

The integrated circuit package has a surface 40 upon which the substrate 12 is mounted in a manner known in the art. The surface 40 of the package 20 includes a plurality of wire bonding pads including pads 42 and 44. The pads 42 and 44 may be power pads or ground pads, for example. Further, the pads may be utilized for coupling to external signals such as external clock signals. The pads 42 and 44 are coupled to the wire bonding pads of the distribution layer 18 by wire bonds 46 and 48. As will be appreciated by those skilled in the art, the package 20 may include additional wire bonding pads (not shown) for being wire bonded to the other wire bonding pads of the distribution layer 18.

Figure 2:
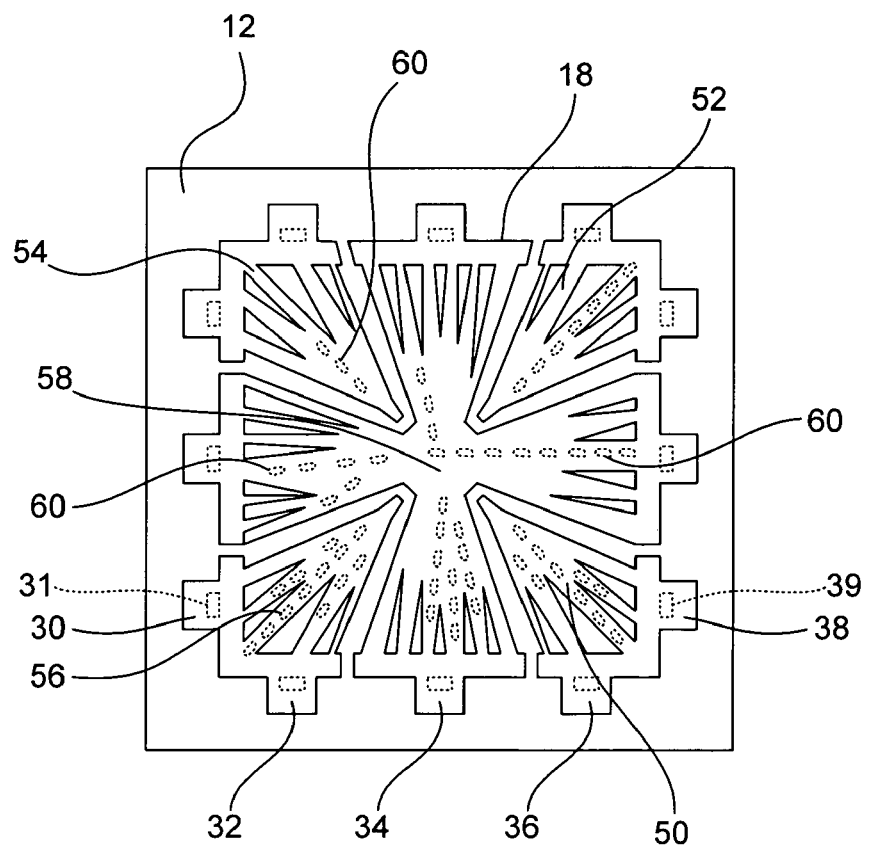
FIG. 2 is a top view of the processed integrated circuit substrate of FIG. 1.

FIG. 2 shows a top view of the processed substrate 12. Here it may be seen that the distribution layer 18 is distributed essentially over the entire substrate 12 with distribution grids 50, 52, 54, 56, and 58 in essentially a star pattern. A plurality of connecting channels or vias 60 connect selected ones of the grids or selected portions of the grids to the interconnection layer 14. In this manner, power voltages and ground may be distributed to the core of the integrated circuit 22 formed in the semiconductor substrate 12 by the distribution layer 18. Other external signals such as clock signals may be similarly distributed throughout the circuit 22 in a similar manner.

Figure 3:
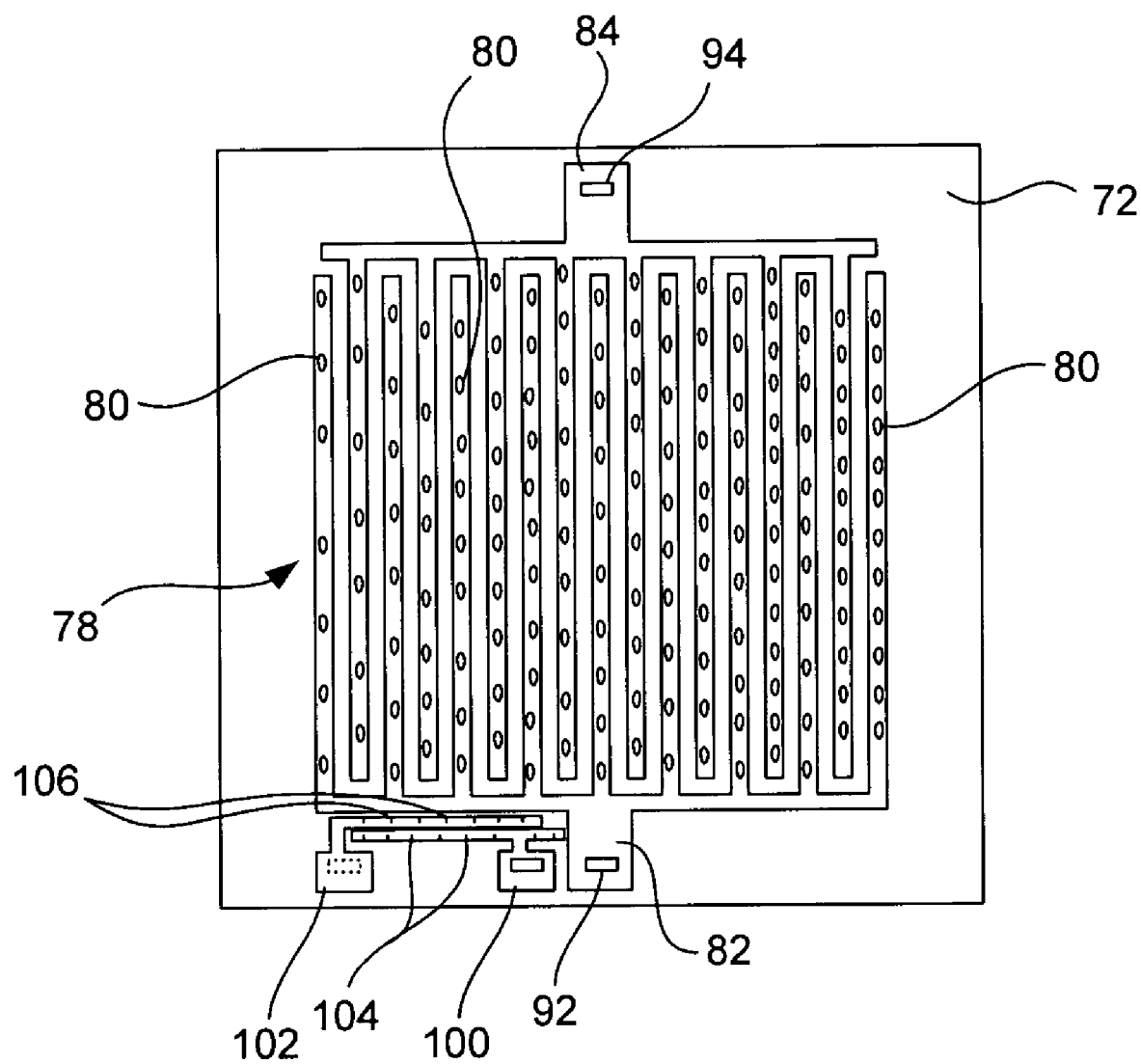
FIG. 3 is a top view of another processed integrated circuit substrate embodying the present invention.

FIG. 3 is a top view of another processed substrate 72 which embodies the present invention. Here, the distribution layer 78 takes the form of an orthogonal grid pattern having vias 80 to electrically connect respective wire bonding pads 82 and 84 to a copper interconnect pattern below (not shown) and thus to the core of the circuit formed in the substrate 72. The pads 82 and 84 make direct connection to the copper interconnect through vias 92 and 94, respectively. Again, the distribution layer 78 extends essentially across the entire area of the substrate 72. One of the pads, such as pad 82 may be coupled to a power device pad of a package to enable power to be distributed throughout the circuit formed in the substrate 72 and the pad 84 may be coupled to a ground pad of the package for distributing ground throughout the circuit formed in the substrate 72.

In addition to the foregoing, the distribution layer 78 includes wire bonding pads 100 and 102 which may be utilized for connecting power and ground to I/O circuits. To this end, the distribution layer extends from the pads 100 and 102 and are coupled to the copper interconnect layer through vias 104 and 106, respectively.

As may thus be seen from the foregoing, the present invention provides an integrated circuit having a distribution layer formed of, for example, aluminum, as an additional interconnect layer to deliver power to I/O cells and to the internal core of the circuit formed in an integrated circuit substrate. The aluminum distribution layer covering the substrate aids in preventing delamination of the copper interconnect layers below. Further, the distribution layer permits power and ground to be distributed throughout the integrated circuit with greater efficiency and provides greater reliability for the overall device. The distribution layer described herein lessens the need for wider metal tracks resulting in reduced semiconductor area. Also, the distribution layer may enable a reduction in the number of copper interconnect layers required thereby decreasing processing cost and further increasing reliability. Because the distribution layer aids in precluding delamination, expensive molding compounds used for this purpose may be eliminated.

While particular objects and advantages of the present invention have been shown and described in the illustrated embodiments, modifications may be made. It is therefore intended in the appended claims to cover all such changes and modifications which fall within the true spirit and scope of the invention.

We claim:

1. An integrated circuit assembly comprising:
   a die of semiconductor material including a circuit disposed in the die;
   an interconnection layer for carrying a signal, the interconnection layer overlying the die and making selective electrical connection to the circuit, the interconnection layer formed of a first conductive material; and
   a distribution layer overlying the interconnection layer, the distribution layer including wire bonding pads for wire bonding to selected electrical signals, and distribution grids for distributing a signal over a region of the interconnection layer, the distribution grids connected to the wire bonding pads and extending over the interconnection layer, wherein at least one of the grids overlies the circuit and all of the grids together substantially cover the die, the distribution layer being formed of a second conductive material different from the first conductive material; and
   a plurality of connecting channels connecting selected ones of the distribution grids to selected locations of the interconnection layer.

2. The assembly of claim 1 wherein the first conductive material is copper.

3. The assembly of claim 2 wherein the second conductive material is aluminum.

4. The assembly of claim 1 wherein the second conductive material is aluminum.

5. The assembly of claim 1 wherein the connecting channels are vias.

6. The assembly of claim 1 wherein the selected locations of the interconnection layer include power connections and wherein at least one of the wire bonding pads is coupled to the power connections.

7. The assembly of claim 1 wherein the selected locations of the interconnection layer include ground connections and wherein at least one of the wire bonding pads is coupled to the ground connections.

8. The assembly of claim 1 wherein the connecting channels are distributed throughout the distribution layer.

9. The assembly of claim 1 further including a package having a surface including wire bonding pads, wherein the substrate is mounted on the package surface, and wherein the assembly further includes wire bonds coupling wire bonding pads of the package to the wire bonding pads of the distribution layer.

10. The assembly of claim 9 wherein the wire bonding pads of the package include ground and power pads.

11. The assembly of claim 1 wherein the wire bonding pads are disposed at the periphery of the distribution layer.

12. The assembly of claim 1 wherein the distribution grids form one of a star pattern and an orthogonal grid pattern.

13. An integrated circuit comprising:
a die of semiconductor material having a circuit disposed in the die;
a first metalization layer overlying the die and operable to couple a signal to the circuit, the first metalization layer including a first section connected to a portion of the circuit and a second section connected to another portion of the circuit, the first metalization layer formed of a first metal;
an insulator layer overlying the first metalization layer and including a plurality of vias; and
a second metalization layer overlying the insulator layer and making selective contact with the first metalization layer through the vias, the second metalization layer including a first region connected to the first section of the first metalization layer, and a second region connected to the second section of the first metalization layer, the first and second regions each operable to distribute a signal to the circuit, wherein at least one of the first and second regions overlies the circuit, and the first and second regions together substantially cover the die, the second metalization layer formed of a second metal different from the first metal.

14. The integrated circuit of claim 13 wherein the first metalization layer is formed of copper.

15. The integrated circuit of claim 14 wherein the second metalization layer is formed of aluminum.

16. The integrated circuit of claim 13 wherein the second metalization layer is formed of aluminum.

17. The integrated circuit of claim 13 wherein the vias are distributed throughout the insulator layer.

18. The integrated circuit of claim 13 further including a package having a surface including wire bonding pads, wherein the substrate is mounted on the package surface, and wherein the assembly further includes wire bonds coupling wire bonding pads of the package to wire bonding pads of the second metalization layer.

19. The integrated circuit of claim 18 wherein the wire bonding pads of the package include ground and power pads.

20. The integrated circuit of claim 13 wherein the second metalization layer includes wire bonding pads disposed at the periphery of the second metalization layer.

21. The integrated circuit of claim 13 wherein the first region forms one of a star pattern and an orthogonal grid pattern.

22. An integrated circuit comprising:
a die of semiconductor material having a circuit disposed in the die;
a copper interconnection layer for carrying a signal, the layer overlying the die;
an insulator layer overlying the copper interconnection layer and including a plurality of vias;
an aluminum distribution layer overlying the insulator layer and making selective contact with the copper interconnection layer through the vias, the aluminum distribution layer including wire bonding pads and distribution grids for distributing a signal over a region of the interconnection layer, the distribution grids coupled to the bonding pads and distributed over the insulator layer, wherein at least one of the grids overlies the circuit and all of the grids together substantially cover the die; and
a package supporting the substrate and including ground and power bonding pads wire bonded to the wire bonding pads.

* * * * *